(12) United States Patent
Wen et al.

(10) Patent No.: US 8,001,437 B2
(45) Date of Patent: Aug. 16, 2011

(54) TEST PATTERN GENERATION METHOD FOR AVOIDING FALSE TESTING IN TWO-PATTERN TESTING FOR SEMICONDUCTOR INTEGRATED CIRCUIT

(75) Inventors: Xiaoqing Wen, Kitakyushu (JP); Kohei Miyase, Kitakyushu (JP); Seiji Kajihara, Kitakyushu (JP)

(73) Assignee: Kyushu Institute of Technology, Kitakyushu-shi (JP)

( * ) Notice: Subject to any disclaimer, the term of this patent is extended or adjusted under 35 U.S.C. 154(b) by 22 days.

(21) Appl. No.: 12/597,106

(22) PCT Filed: Apr. 11, 2008

(86) PCT No.: PCT/JP2008/057191
§ 371 (c)(1),
(2), (4) Date: Oct. 22, 2009

(87) PCT Pub. No.: WO2008/133052
PCT Pub. Date: Nov. 6, 2008

(65) Prior Publication Data
US 2010/0095179 A1    Apr. 15, 2010

(30) Foreign Application Priority Data

Apr. 23, 2007  (JP) ................................ 2007-113238

(51) Int. Cl.
*G01R 31/28* (2006.01)
*G06F 11/00* (2006.01)
(52) U.S. Cl. ........................................ 714/738; 714/736
(58) Field of Classification Search .................. 714/738, 714/724, 30, 726, 729, 736
See application file for complete search history.

(56) References Cited

U.S. PATENT DOCUMENTS

| 6,148,425 | A  | * | 11/2000 | Bhawmik et al. | 714/726 |
| 6,975,978 | B1 | * | 12/2005 | Ishida et al.  | 703/15  |
| 7,131,081 | B2 | * | 10/2006 | Wang et al.    | 716/136 |
| 7,313,743 | B2 | * | 12/2007 | Wang et al.    | 714/726 |

(Continued)

FOREIGN PATENT DOCUMENTS

JP    3-231174 A    10/1991

(Continued)

OTHER PUBLICATIONS

International Search Report of PCT/JP2008/057191, mailing date of Jul. 15, 2008.

(Continued)

*Primary Examiner* — Phung M Chung
(74) *Attorney, Agent, or Firm* — Westerman, Hattori, Daniels & Adrian, LLP

(57) ABSTRACT

A test pattern generation method for determining if a combinational portion 17 is defective, by applying test patterns to a semiconductor integrated circuit 10 and comparing responses to the test patterns with expected responses, the method including: a first step of generating test patterns having logic bits for detecting defects and unspecified bits; a second step of selecting critical paths 19, 19a, 19b generated by the application of the test patterns; a third step of identifying critical gates on the critical paths 19, 19a, 19b; and a fourth step of determining unspecified bits so that a critical capture transition metric, which indicates the number of the critical gates whose states are changed, is reduced; wherein by reducing the critical capture transition metric, output delays from the critical paths 19, 19a, 19b are prevented, and thereby false testing can be avoided.

3 Claims, 7 Drawing Sheets

U.S. PATENT DOCUMENTS

| | | |
|---|---|---|
| 2002/0104065 A1 | 8/2002 | Tsukiyama et al. |
| 2004/0132224 A1 | 7/2004 | Tsukiyama et al. |
| 2005/0235177 A1 | 10/2005 | Ohara et al. |
| 2007/0033554 A1 | 2/2007 | Tsukiyama et al. |

FOREIGN PATENT DOCUMENTS

| | | |
|---|---|---|
| JP | 2641954 B2 | 8/1997 |
| JP | 10-134093 A | 5/1998 |
| JP | 2002-279012 A | 9/2002 |
| JP | 2005-285144 A | 10/2005 |
| JP | 2005-308471 A | 11/2005 |
| JP | 2005-327308 A | 11/2005 |
| JP | 2006-155644 A | 6/2006 |

OTHER PUBLICATIONS

Xiaoqing Wen, et al, "Critical-Path-Aware X-Filling for Effective IR-Drop Reduction in At-Speed Scan Testing", Design Automation Conference 44th ACM/IEEE, Jun. 4, 2007, pp. 527-532.

Yasuo Sato, et al, "Invisible Delay Quality—SDQM Model Lights Up What Could Not Be Seen", Test Conference 2005 Proceedings ITC 2005, Nov. 8, 2005, p. 47.1, 1-9.

Xiaoqing Wen, et al, "On Low-Capture-Power Test Generation for Scan Testing", VLSI Test Symposium Proceedings 23rd IEEE, May 1, 2005, pp. 265-270.

Ranganathan Sankaralingam, et al, "Reducing Power Dissipation During test Using Scan Chain Disable", VSLI Test Symposium, Apr. 29, 2001, pp. 319-324.

\* cited by examiner

TEST PATTERN GENERATION METHOD FOR AVOIDING FALSE TESTING IN TWO-PATTERN TESTING FOR SEMICONDUCTOR INTEGRATED CIRCUIT

TECHNICAL FIELD

The present invention relates to a test pattern generation method for avoiding false testing in two-pattern testing for a semiconductor integrated circuit.

BACKGROUND ART

The trend of the semiconductor integrated circuit technology towards larger scales and smaller feature sizes is significantly increasing the number of gates (logic elements) and flip-flops (state memory elements). As a result, test patterns applied to semiconductor integrated circuits for determining if the circuits are defective and the resulting power dissipation are increasing, and test quality is decreasing.
In particular, as power supply voltage gets lower and lower, semiconductor integrated circuits become less resistant to IR-drop during testing. IR-drop is a phenomenon that occurs when test patterns cause transitions at output logic of gates and flip-flops in a semiconductor integrated circuit, and a power supply voltage temporarily drops due to an excessive current flowing through the circuit. More specifically, a path delay related to a test response increases in accordance with IR-drop, and a timely test response cannot be obtained. In this manner, the false testing problem is getting worse and worse, resulting in false test responses caused by timing violations. As a result, the proportion of defect-free devices for all devices manufactured (i.e., yield) of semiconductor integrated circuits is decreasing. The false testing problem is specifically significant in two-pattern testing, which needs to have strict timing requirements. Two-pattern testing herein is defined as testing that applies two patterns ($v_1$ and $v_2$) shown in FIG. 7, for example, to a semiconductor integrated circuit for detecting timing-related defects.

To prevent false testing, IR-drop must be reduced during testing. Therefore, test patterns capable of reducing the number of gates, which cause output logic transitions, are required. In this aspect, X-filling helps to obtain such test patterns. X-filling is to properly assign logic values "0" or "1" to some unspecified bits (referred to as X-bits) in a test pattern based on specific purposes, the test pattern not reducing the fault detection capability for a predetermined semiconductor circuit. For the two test patterns ($v_1$ and $v_2$) shown in FIG. 7, for example, if proper logic values are assigned to the X-bits in the test patterns so that the difference, caused by the patterns ($v_1$ and $v_2$), between the output logic values of each of the gates in a semiconductor circuit is reduced, then IR-drop in the circuit can be reduced. As a result, false testing is also reduced.

Non-patent document 1 describes an X-filling technique for sequentially determining if each of the bits can be turned into an unspecified bit or not, thereby identifying unspecified bits in each test pattern. With this technique, when logic values are assigned to the unspecified bits, only the unspecified bit at a pseudo primary input (test pattern) is considered, while the unspecified bit at a pseudo primary output (test response) is ignored. In addition, Non-patent document 2 describes a technique for identifying arbitrary bits as unspecified bits for all test patterns. With this technique, when logic values are assigned to the unspecified bits, only one bit-pair of a pseudo primary input and a pseudo primary output is considered, and the correlation between the bit-pairs is ignored.

Non-patent document 1: R. Sankaralingam, R. Oruganti, N. Touba, "Reducing Power Dissipation during Test Using Scan Chain Disable," Proceedings, VLSI Test Symposium, 2001, pp. 319-324

Non-patent document 2: X. Wen, Y. Yamashita, S. Kajiihara, L. T. Wang, K. K. Saluja, K. Kinoshita, "On Low-Capture-Power Test Generation For Scan Testing," Proceedings, VLSI Test Symposium, May 2005, pp. 265-270

DISCLOSURE OF INVENTION

Problems to be Solved by the Invention

In the technique described in non-patent document 1, the correlation between the test patterns is completely ignored; thus, unspecified bits that are effective in preventing false testing may not be obtained. Additionally, since the unspecified bit at the pseudo primary output is ignored when the logic values are assigned to the unspecified bits, even if the unspecified bits that are effective in preventing false testing are obtained, the obtained unspecified bits may not be most effective in preventing false testing.
On the other hand, the technique described in non-patent document 2 may cause bits, which are more effective when being specified, may be turned into the unspecified bits. Additionally, the correlation between bit-pairs is ignored in the assignment of the logic values to the unspecified bits, which means that the most effective prevention of false testing cannot be expected.

The present invention has been made in view of the above circumstances, and it is an object of the present invention to provide a test pattern generation method for avoiding false testing in two-pattern testing for a semiconductor integrated circuit, the method lowering power dissipation by reducing the number of gates whose output logic values are changed during testing.

Means for Solving the Problems

To accomplish the above object, a first aspect of the present invention provides a test pattern generation method for avoiding false testing in two-pattern testing for a semiconductor integrated circuit, the method including applying test patterns to a semiconductor integrated circuit having a logic portion comprising a combinational portion with a plurality of gates, each test pattern being a combination of logic values of "0" and "1," measuring responses at the rated functional speed of the semiconductor integrated circuit, comparing the measured responses with expected responses to the test patterns, and determining if the combinational portion is defective, the method comprising:

a first step of generating, as test stimuli, a two-pattern test set, each pair of test patterns comprising of an initialization pattern for initializing gate states and a launch pattern for detecting defects, wherein some logic bits for detecting defects in the combinational portion are specified and remaining bits are unspecified bits;

a second step of obtaining signal paths formed in the combinational portion by the application of the test patterns (i.e., by the application of the initialization pattern and the launch pattern sequentially) based on given information on the combinational portion, arranging the paths in descending order of the number of the gates on the paths, and selecting a plurality of the paths within a preset range as critical paths;

a third step of identifying critical gates, the critical gates including the gates on each of the critical paths, the critical gates existing in a predetermined gate distance from each of the critical paths; and a fourth step of obtaining a critical capture transition metric for the critical gates whose states are changed by the application of the test patterns, among all of the critical gates, and assigning either logic values "0" or "1" to unspecified bits in the test patterns so that the critical capture transition metric is reduced; wherein by reducing the critical capture transition metric, a power supply voltage drop at each of the critical gates is reduced;

excessive delays at the output from each of the critical paths are prevented; and false testing is avoided, which falsely declares a defect-free semiconductor integrated circuit as a defective one.

The term "initialization" herein is defined as setting a predetermined logic value ("0" or "1") to input lines of each of the gates inside, and the "initialization pattern" is defined as a test pattern for processing the initialization. Also, the term "launch pattern" is defined as a particular test pattern for causing logic value transitions with respect to the initialization pattern.

To accomplish the above object, a second aspect of the present invention provides a test pattern generation method for avoiding false testing in two-pattern testing for a semiconductor integrated circuit, the method including applying test patterns to a semiconductor integrated circuit having a logic portion comprising a combinational portion with a plurality of gates, each test pattern being a combination of logic values of "0" and "1," measuring responses at the rated functional speed of the semiconductor integrated circuit, comparing the measured responses with expected responses to the test patterns, and determining if the combinational portion is defective, the method comprising:

a first step of generating, as test stimuli, a two-pattern test set, each pair of test patterns comprising of an initialization pattern for initializing gate states and a launch pattern for causing logic bit transitions with respect to the initialization pattern, wherein some logic bits for detecting defects in the combinational portion are specified and remaining bits are unspecified bits;

a second step of obtaining signal paths formed in the combinational portion by the application of the test patterns (i.e., by the application of the initialization pattern and the launch pattern sequentially) based on given information on the combinational portion, arranging the paths in descending order of path lengths (e.g., propagation time of the signals), and selecting a plurality of the paths within a preset path length range as critical paths;

a third step of identifying critical gates, the critical gates including the gates on each of the critical paths, the critical gates existing in a predetermined gate distance from each of the critical paths; and a fourth step of obtaining a critical capture transition metric for the critical gates whose states are changed by the application of the test patterns, among all of the critical gates, and assigning either logic values "0" or "1" to unspecified bits in the test patterns so that the critical capture transition metric is reduced; wherein by reducing the critical capture transition metric, a power supply voltage drop is reduced, which occurs when current flows through each of the critical paths;

an increase in excessive delays at each of the critical paths is prevented; and false testing is avoided, which falsely declares a defect-free semiconductor integrated circuit as a defective one.

According to the method in the first and the second aspects of the present invention, it is preferable that a critical gate weight is calculated for each of the critical gates by using the gate distance and a probability that each of the critical paths is formed by the application of test patterns, and distribution of the critical gates corresponding to each of the critical paths is evaluated quantitatively.

According to the method in the first and the second aspects of the present invention, it can be said that the critical capture transition metric is the sum of gate critical capture transition metrics of the respective critical gates, each of the gate critical capture transition metrics calculated based on the critical gate weight of the critical gate, a transition probability that the gate state is varied in accordance with the application of test patterns, and the number of signal output lines obtained from the circuit information of the combinational portion.

According to the method in the first and the second aspects of the present invention, it is preferable that test cubes bits are obtained in advance, the test cubes including unspecified bits appearing at the same critical gate before and after the application of the launch pattern to the combinational portion, an impact factor, which is a quantified impact degree affecting the critical gate, is determined for each of the test cubes, effective critical gate weight is calculated for each of the critical gates affected by the unspecified bits based on the critical gate weights and the impact factors, and the logic values are assigned to the unspecified bits in descending order of X-priority, which is the sum of the effective critical gate weights.

According to the method in the first and the second aspects of the present invention, it is preferable that, when the logic values are assigned (allocated) to the unspecified bits, each of the critical capture transition metrics is calculated using the logic values, and the logic values reducing the critical capture transition metrics are selected as the unspecified bits.

The formation of a critical path calculated probabilistically based on an initialization pattern and a launch pattern (for example, calculated by conducting probability propagation) is referred to as an "activation probability."

The term "critical gate weight" is defined as a quantitatively rated impact degree (distribution) of a critical gate to each critical path. The critical gate weight is a function of a gate distance and an activation probability.

The term "gate critical capture transition metric" is defined as the impact of critical gates whose states are changed. The gate critical capture transition metric is calculated based on the critical gate weights, transition probabilities of the critical gate states, and the number of output lines of the critical gate signals.

The term "critical capture transition metric" is the sum of the gate critical capture transition metrics of all critical gates. The critical capture transition metric is a criterion for determining (selecting) logic values to unspecified bits.

The term "impact factor" is defined as a quantified impact degree affecting critical gates. The impact factor is determined for each test cube of the critical gates, which is obtained in advance, since a region affected by unspecified bits is different at the same critical gate before and after the application of a launch pattern.

The "effective critical gate weight" herein is obtained by multiplying a critical gate weight and an impact factor.

The "X-priority" herein is obtained by adding the effective critical gate weights of the respective critical gates. The greater the X-priority is, the greater the number of the critical gates affected by the unspecified bits becomes.

EFFECT OF THE INVENTION

In the method according to the first and the second aspects of the present invention, false testing for semiconductor integrated circuits can be avoided, which thereby enables a higher quality test of the circuits. As a result, advanced automation systems for test designs of semiconductor integrated circuits can be constructed.

In particular, in the method according to the first and the second aspects of the present invention, if the critical gate weight is calculated for each of the critical gates by using the gate distance and a probability that each of the critical paths is formed by the application of test patterns, and the distribution of critical gates corresponding to each of the critical paths is evaluated quantitatively, then the relationship between the critical gates and the critical paths can be evaluated quantitatively by using the critical gate weights.

In the method according to the first and the second aspects of the present invention, if the critical capture transition metric is the sum of gate critical capture transition metrics of the respective critical gates, each of the gate critical capture transition metric calculated based on:

the critical gate weight of the critical gate;

a transition probability that the gate state is varied in accordance with the application of test patterns; and the number of signal output lines obtained from the circuit information of the combinational portion, then the number of the critical gates affecting the activations of critical paths can be evaluated quantitatively by using the critical capture transition metric.

In the method according to the first and the second aspects of the present invention, if the test cubes including the unspecified bits, appearing in the same critical gate before and after the application of the launch pattern to the combinational portion, are obtained in advance;

an impact factor that is a quantified impact degree affecting the critical gate is determined for each of the test cubes;

effective critical gate weight is calculated for each of the critical gates affected by the unspecified bits based on the critical gate weights and the impact factors; and the logic values are assigned to the unspecified bits in descending order of X-priority, which is the sum of the effective critical gate weights, then the logic values are assigned to the unspecified bits in descending order of the effect on the critical capture transition of the critical gates. Therefore, the critical capture transition metric can be reduced effectively.

In the method according to the first and the second aspects of the present invention, it is possible to calculate each of the critical capture transition metrics using the logic values when assigning logic values to the unspecified bits, and to select logic values that reduce the critical capture transition metrics as unspecified bits. As a result, the logic values, which reduce the critical capture transition metric, are assigned to the unspecified bits, and the critical capture transition metric corresponding to the application of test patterns can thereby be reduced.

DESCRIPTION OF NUMERALS

10: semiconductor integrated circuit, 11: memory portion, 12: mixed signal, 13: internal clock, 14: high-speed I/O, 15: data transfer portion, 16: logic portion, 17: combinational portion, 19, 19a, 19b: critical path, 20-27: gate, 20a, 20b, 21a, 21b: gate, 28: output of gate, 29: region, 30, 31: critical path, 32: path, 33: gate

BEST MODE FOR CARRYING OUT THE INVENTION

Referring to the accompanying drawings, embodiments of the present invention will be described for a better understanding of the present invention.

Figure 1:
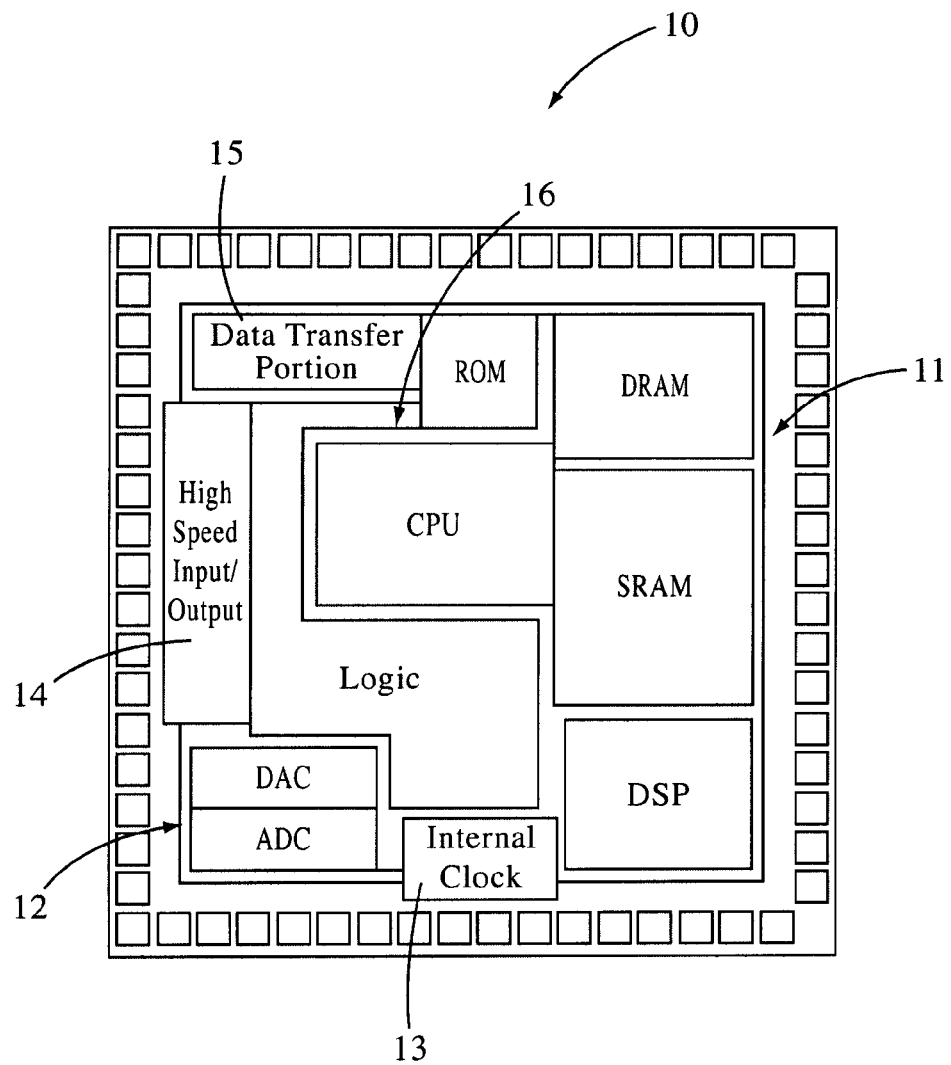
FIG. 1 illustrates a configuration of a semiconductor integrated circuit to which a test pattern generation method for avoiding false testing in two-pattern testing for a semiconductor integrated circuit, according to a first embodiment of the present invention, is applied.

FIG. 1 shows a semiconductor integrated circuit 10 to which a test pattern generation method for avoiding false testing in two-pattern testing for a semiconductor integrated circuit, according to a first embodiment of the present invention, is applied. The semiconductor integrated circuit 10 includes:

a memory portion 11 with ROM (Read Only Memory), DRAM (Dynamic Random Access Memory), and SRAM (Static Random Access Memory);

a mixed signal 12 with D/A converter (DAC) and A/D converter (ADC);

an internal clock 13, which emits operation timing signals;

a high-speed I/O 14;

a data transfer portion 15; and a logic portion 16 with Logic region for logic processing, DSP (Digital Signal Processor) for signal processing, and CPU (Central Processing Unit) for controlling various processing operations.

In addition, the logic portion 16 has a combinational portion with a plurality of gates, and the combinational portion 16 is a target of the two-pattern testing for the semiconductor integrated circuit 10.

The following explains a test pattern generation method for avoiding false testing in two-pattern testing for a semiconductor integrated circuit according to a first embodiment of the present invention.

The test pattern generation method for avoiding false testing in two-pattern testing for the semiconductor integrated circuit according to the first embodiment of the present invention (hereinafter simply referred to as the test pattern generation method) includes:

applying test patterns to a semiconductor integrated circuit 10 having a logic portion 16 comprising a combinational portion with a plurality of gates, each test pattern being a combination of logic values of "0" and "1;"

measuring responses at the rated functional speed of the semiconductor integrated circuit 10;

comparing the measured responses with expected responses to the test patterns;

and determining if the combinational portion is defective.

Figure 2:
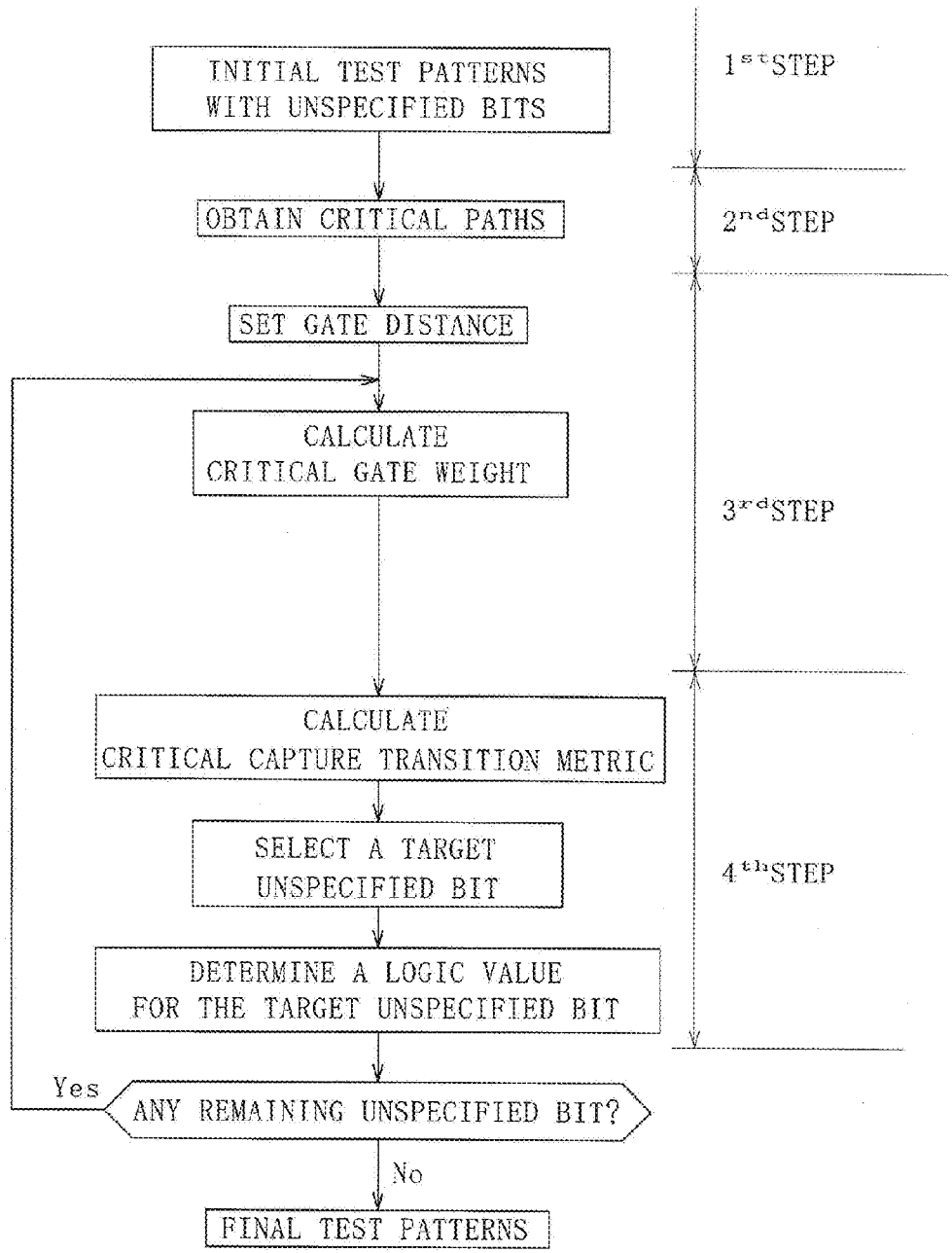
FIG. 2 is a flow process chart of the test pattern generation method.

As shown in FIG. 2, the test pattern generation method includes:

a first step of generating, as test stimuli, a two-pattern test set, each pair of test patterns comprising of an initialization pattern for initializing gate states and a launch pattern for detecting defects, wherein some logic bits for detecting defects in the combinational portion are specified and remaining bits are unspecified bits X;

a second step of obtaining signal paths formed in the combinational portion by the application of the test patterns based on given information on the combinational portion, arranging the paths in descending order of the number of the gates on the paths, and selecting a plurality of the paths within a preset range as critical paths;

a third step of identifying critical gates, the critical gates including the gates on each of the critical paths, the critical gates existing in a predetermined gate distance from each of the critical paths; and a fourth step of obtaining a critical capture transition metric for the critical gates whose states are changed by the application of the test patterns, among all of the critical gates, and assigning either logic values "0" or "1" to unspecified bits in the test patterns so that the critical capture transition metric is reduced. Detailed descriptions are given as follows.

As for a test pattern for detecting timing-related defects, in order to change the state of a gate that is a detection target, among minimum units (hereinafter referred to as bits) forming the test pattern, some particular bits are assigned logic values for determining a part of the test pattern, and then remaining bits can be arbitrarily assigned logic values. Thus, the bits, of which the logic values can be determined arbitrarily, become unspecified bits X without being assigned specific logic values, and thereby the test pattern is determined (Descriptions hereinbefore are the first step.)

Figure 3:
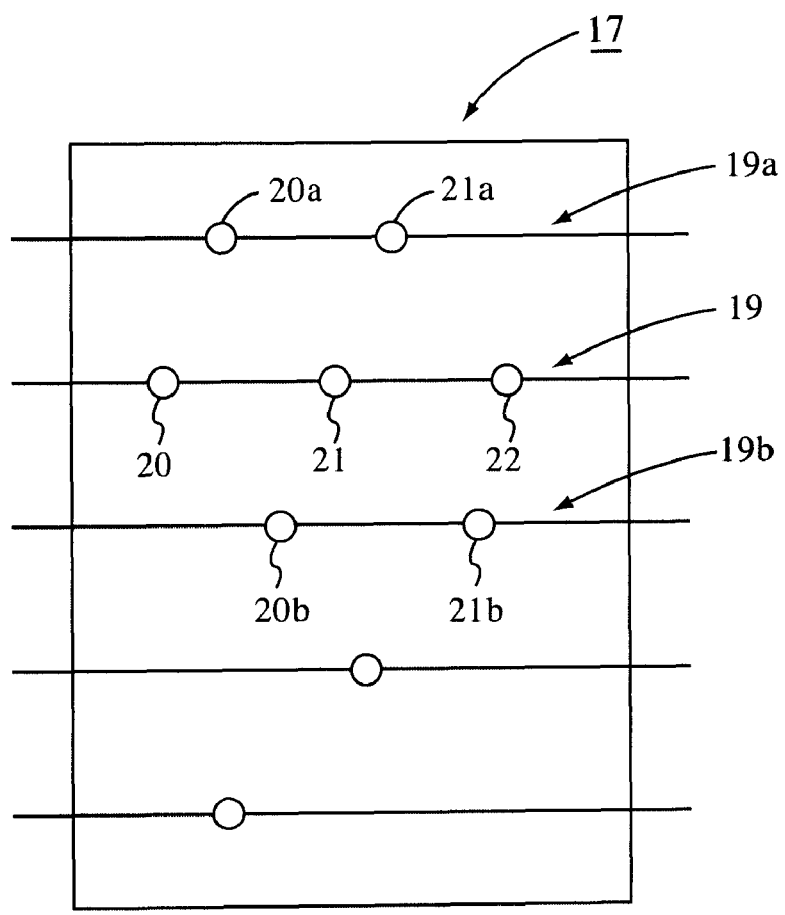
FIG. 3 is a schematic view of signal paths and critical paths, which are formed in a combinational portion by the application of test patterns, according to the test pattern generation method.

If the determined test pattern is applied to the semiconductor integrated circuit 10, specifically to the combinational portion 17 of the logic portion 16, propagation state of gate transitions in the combinational portion 17 is obtained based on given information on the combinational portion 17. In this way, as shown in FIG. 3, signal paths formed in the combinational portion 17 by the application of the test pattern can be obtained. As the signal paths are obtained, the most greatly delayed signal is the one passing through the path having the largest number of the gates among the paths formed in the combinational portion 17, i.e., the path having gates 20, 21, and 22. Also, the path having the second largest number of the gates, specifically, the path having the gates 20a, 21a or 20b, 21b might have a significant signal delay due to a signal input from the gate existing near these paths. Therefore, the paths in the combinational portion 17 are arranged in descending order of the number of the gates on the paths, and a plurality of the paths within a preset range are selected as critical paths 19, 19a, and 19b in descending order (Descriptions hereinbefore are the second step.) The preset range herein is, for example, a range within the top 60%, preferably 50%, and more preferably 30%, of the paths, including the path having the maximum number of the gates.

Figure 4:
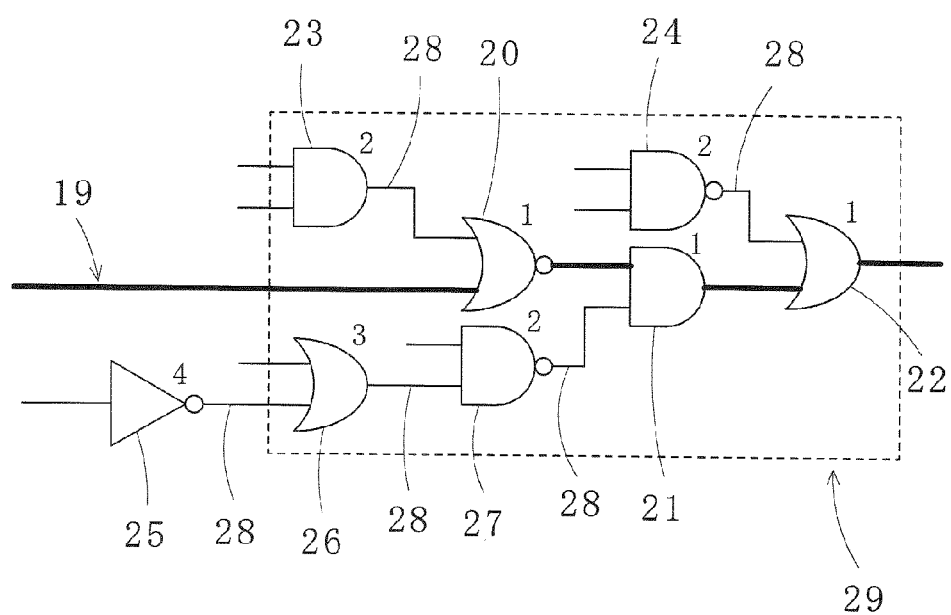
FIG. 4 illustrates the relationship between critical paths and critical gates according to the test pattern generation method.

After the selection of the critical paths 19, 19a, and 19b, the critical gates, existing in a predetermined gate distance from each of the critical paths 19, 19a, and 19b, are respectively identified. As shown in FIG. 4, for the critical path 19, for example, gates including gates 20, 21, and 22, being connected to the gates 20, 21, and 22, and existing within the predetermined distance "r" from the critical path 19 are identified as the critical gates, the gates 20, 21, and 22 forming the critical path 19. In this example, the gate distance "r" is defined as: r=d+1, given that the gate distance "r" of the gates 20, 21, and 22 is "1" and the number of outputs 28 of the gates is "d", the outputs 28 forming the shortest path when the critical gate is connected to the gates 20, 21, and 22 on the critical path 19. Note that "d" corresponds to the number of the gates from the gates 20, 21, and 22 (hereinafter referred to as logic level) if the gates connected to the gates 20, 21, and 22 are counted by the logic level.

As shown in FIG. 4, if the gates 23, 24, 25, 26, and 27 exist around the critical path 19, the gates 23, 24, and 27 are respectively connected to the gates 20, 22, and 21 via the one output 28 of the gate (the gates 23, 24, and 27 are the first logic level gates), and thus "r=1+1," in short, "r=2." Similarly, the gate 26 is connected to the gate 21 via the two outputs 28 of the gates (the gate 26 is the second logic level gate), and thus "r=3." The gate 25 is connected to the gate 21 via the three outputs 28 of the gates (the gate 25 is the third logic level gate), and thus "r=4." Each number appended to each of the gates 20 to 27 indicates the gate distance "r." If the range of gate distance is set to "3," critical gates for the critical path 19 are, as shown in FIG. 4, the gates 20, 21, 22, 23, 24, 26, and 27 existing within a region 29.

As for the critical paths 19a and 19b, the gate distances "r" of the gates thereseparate are respectively calculated, and the gates within the gate distance "3," as same as the critical path 19, are identified as the critical gates.

For each of the critical gates of the critical paths 19, 19a, and 19b, critical gate weight CW is calculated using the gate distances "r" and an activation probability AP that the critical paths 19, 19a, and 19b are formed by the application of the test patterns. Then, an impact degree (i.e., distribution) of the critical gates for each of the critical paths 19, 19a, and 19b is evaluated quantitatively. For example, in the case of the critical path 19, for each of the critical gates 20, 21, 22, 23, 24, 26, and 27, the critical gate weight CW is calculated using the gate distance "r" and the activation probability AP of the critical path 19 formed by the application of test pattern.

Figure 5:
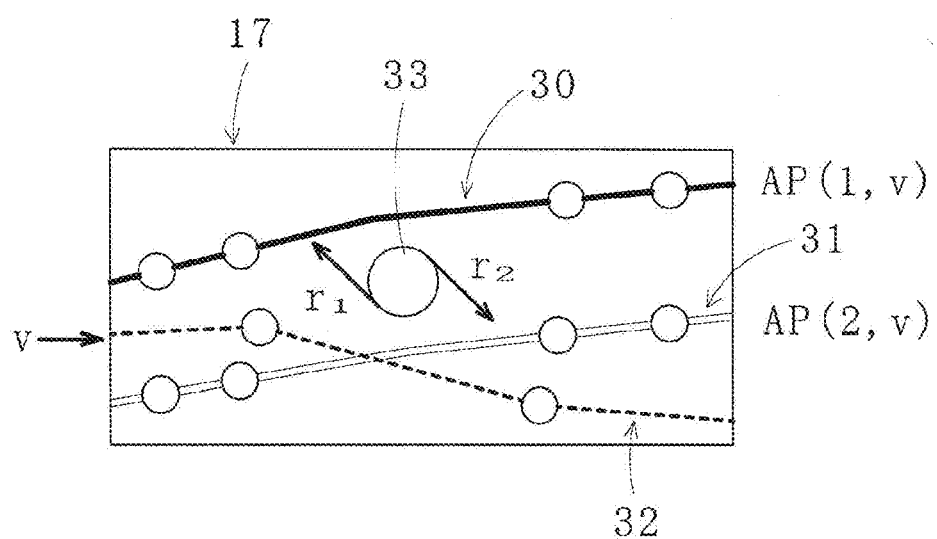
FIG. 5 illustrates states of the paths activated by the application of the test patterns, according to the test pattern generation method.

As shown in FIG. 5, if the two critical paths 30 and 31, as well as another path 32, are formed inside the combinational portion 17, and one gate 33 is a critical gate for the critical paths 30 and 31 (the gate 33 is shared by both of the critical paths 30 and 31), then the critical gate weight CW of the gate 33 is calculated using (i) the gate distances "$r_1$" and "$r_2$" from the gate 33 to the critical paths 30 and 31 and (ii) the activation probabilities AP (1, v) and AP (2, v) of the critical paths 30 and 31 formed by the application of the test pattern "v."

In the calculation of the critical gate weight CW, generally, it is assumed that the smaller the gate distances "$r_1$" and "$r_2$" are and the higher the activation probabilities AP (1, v) and AP (2, v) of forming the critical paths 30 and 31 are, the greater the impact degree of the gate 33 to each of the critical paths 30 and 31 becomes. The critical gate weight CW of the critical gate 33, for example, can be set in inverse proportion to the gate distances and in proportion to the activation probabilities AP of the critical paths 30 and 31, and the CW is obtained in the formula: $CW = AP(1,v)/r_1 + AP(2,v)/r_2$ (Descriptions hereinbefore are the third step.)

Next, the critical capture transition metric CCT (v) is calculated, which indicates the number of the critical gates $G_i$ changed in the gate states by the application of the test pattern, among all of the critical gates $G_i$ (i=1 to m) formed in accordance with the formation of the critical paths. Here, the critical capture transition metric CCT (v) is the sum of:

the critical gate weights CW ($G_i$, v) of the critical gates $G_i$;

transition probabilities $p_i$ that the gate states of the critical gates $G_i$ are varied with the application of the test pattern "v"; and the gate critical capture transition metrics cct ($G_i$, v) for each of the critical gates calculated based on the number of the signal output lines $f_i$, the signal output lines $f_i$ obtained from the given information on the combinational portion 17.

It is assumed that the greater the critical gate weights CW ($G_i$, v) of the critical gates $G_i$ formed by the formation of the critical paths are and the higher the transition probabilities $p_i$ of the critical gates $G_i$ are, the greater the gate critical capture transition metric cct ($G_i$, v) becomes. If the number of the signal output lines $f_i$ extending from the critical gates $G_i$ is large, the effect of the gate state change can be propagated to the critical gates therearound. Eventually, it is also assumed that the effect of the gate state transition on the critical capture transition metric CCT (v) becomes greater. Thus, the larger the number of the signal output lines $f_i$ is, the greater the gate critical capture transition metric cct ($G_i$, v) becomes. Therefore, given that the gate critical capture transition metric cct ($G_i$, v) is proportional to the critical gate weights CW ($G_i$, v), the transition probabilities $p_i$ of the critical gates $G_i$, and the number of the signal output lines $f_i$ extending from the critical gates $G_i$, the CCT (v) is calculated as follows:

$$CCT(v) = cct(G_1, v) + cct(G_2, v) + \ldots + cct(G_m, v)$$
$$= CW(G_1, v)p_1 f_1 + CW(G_2, v)p_2 f_2 + \ldots +$$
$$CW(G_m, v)p_m f_m$$

Figure 6:
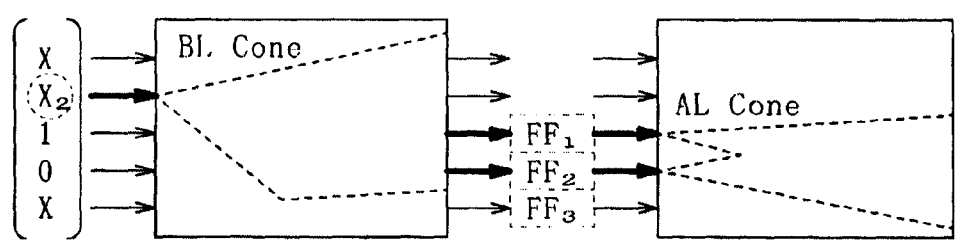
FIG. 6 is a schematic view showing the distributions of the critical gates in the combinational portion, in which the critical gates to be affected by one unspecified bit in a test pattern before the application of the test pattern and unspecified bits via flip-flops, according to the test pattern generation method.
Figure 7:
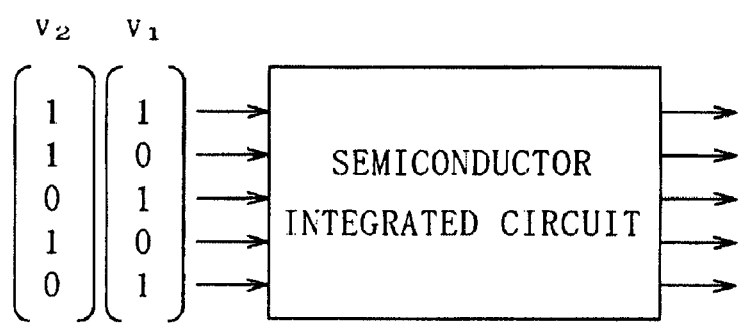
FIG. 7 illustrates the two-pattern test.

In general, if an unspecified bit X exists in a test pattern, the unspecified bit X also appears in a test response to the test pattern. Therefore, the effect of the unspecified bit X on the number of the critical gates $G_i$ can be explained as follows. For example, in the case of two-pattern testing by a broadside scheme, as shown in FIG. 6, when the initialization pattern "v" of the test patterns is applied to the combinational portion 17, the gate state transition is propagated in the combinational portion 17 in accordance with each of the bits in the initialization pattern "v." The region, indicated as BL Cone in FIG. 6, is an existence region of the critical gates $G_i$ in the combinational portion 17, to which an unspecified bit X2 propagates. The unspecified bit X2 is the second bit from the top of the initialization pattern "v." Reference character 40 shows a distribution of the critical gates in the combination portion. Reference 41 illustrates a two pattern test.

On the other hand, after the initialization pattern "v" in the FIG. 6 is applied to the combinational portion 17 and the output response is captured to the flip-flop $FF_i$, the launch pattern, which is formed with the logic values imported to the flip-flop $FF_i$, is applied to the combinational portion 17. Thus, the propagation of the gate state change, which is generated in the combinational portion 17 in accordance with each bit, will be changed. The region, indicated as AL Cone in FIG. 6, is an existence region of the critical gates $G_i$ in the combinational portion 17, to which the unspecified bit $X_2$ propagates, when the unspecified bit $X_2$ is affected by the flip-flop $FF_1$ and $FF_2$, for example.

As described above, in the same critical gate $G_i$, the region to be affected by the unspecified bit $X_2$ is different before and after the launch pattern application. Therefore, as shown in Table 1, the test cubes of the critical gates $G_i$ are obtained in advance, so that impact factor IF ($G_i$, $X_2$, v), which is a quantified impact degree on the critical gate $G_i$, can be determined for each of the test cubes.

In Table 1, "Yes" indicates that the critical gate $G_i$ exists in the BL Cone and the AL Cone, "No" indicates that the critical gate $G_i$ does not exist in either of them, and "Yes or No" indicates that the critical gate $G_i$ appears in either the BL Cone or AL Cone. Since the unspecified bit $X_2$ can be easily defined for patterns A, B, and C, the impact factors IF ($G_i$, $X_2$, v) are set to be larger. For example, IF 1.00 is set for the pattern A, IF 0.80 is set for the pattern B, and IF 0.60 is set for the pattern C. On the other hand, for patterns D and E that have the critical gate $G_i$ in either BL Cone or AL Cone, the impact factor IF ($G_i$, $X_2$, v) is set to be smaller. For example, IF 0.40 is set for the pattern D, and IF 0.20 is set for the pattern E. Additionally, for pattern F, which have the critical gate $G_i$ in neither BL Cone nor AL Cone, the impact factor IF ($G_i$, $X_2$, v) is set to "0."

TABLE 1

| | | | $G_i$ Logic value | | |
| --- | --- | --- | --- | --- | --- |
| Pat-tern | $G_i$ Location | | Before Launch Pattern Application | After Launch Pattern Application | Impact Factor IF ($G_i$, $X_2$, v) |
| | BL Cone | AL Cone | | | |
| A | Yes | Yes or No | X | 0/1 | 1.00 |
| B | Yes or No | Yes | 0/1 | X | 0.80 |
| C | Yes | Yes | X | X | 0.60 |
| D | Yes | No | X | X | 0.40 |
| E | No | Yes | X | X | 0.20 |
| F | No | No | — | — | 0.00 |

For each of the critical gates $G_i$ affected by the unspecified bit X2, an effective critical gate weight ECW ($G_i$, v) is calculated based on the critical gate weight CW ($G_i$, v) and the impact factor IF ($G_i$, $X_2$, v), and an unspecified bit parameter XP ($X_2$, v) can be obtained. For example, the ECW is calculated by multiplying the critical gate weight CW ($G_i$, v) and the impact factor IF ($G_i$, $X_2$, v). The XP ($X_2$, v) can be obtained as the sum of the effective critical gate weights ECW ($G_i$, v) for the respective critical gates $G_i$.

X-priority $XP(X_2, v) = CW(G_i, v)$ IF $(G_i, X_2, V) + \ldots + CW(G_m, v)$ IF $(G_m, X_2, v)$ In addition, the greater the X-priority XP ($X_2$, v) is, the greater the number of the critical gates $G_i$ affected by the unspecified bit $X_2$ becomes.

For the other unspecified bits $X_k$ (k=1 to m) in the test pattern, the unspecified bit parameters XP ($X_k$, v) are respectively obtained. A specific logic value is assigned to the unspecified bit $X_k$ having the largest X-priority XP ($X_k$, v) to prevent the gate states of the critical gates $G_i$ from changing. And thus, the number of the critical gates $G_i$, whose states are changed by the unspecified bit $X_k$, and the critical capture transition metric CCT (v) can be reduced. When the specified logic value is assigned to the unspecified bit $X_k$, CCT (0) and CCT (1) are actually obtained. Then, if CCT (0)<CCT (1), "0" is selected for the unspecified bit $X_k$, and if CCT (0)>CCT (1), "1" is selected for the unspecified bit $X_k$. As a result, the critical capture transition metric CCT (v) of the critical gates $G_i$, whose states are changed by the unspecified bit $X_k$, can be reduced (Descriptions hereinbefore are the fourth step.)

By assigning a specified logic value to an unspecified bit $X_k$ having the largest X-priority XP ($X_k$, v) and repeating the same process to the other unspecified bits X, the logic values can be assigned to all the unspecified bits X appearing in the test pattern. Then, the critical capture transition metrics of the critical gates $G_i$, which are generated when the critical paths 19, 19a, and 19b are formed by the application of the test pattern to the semiconductor integrated circuit 10, can be reduced, thereby preventing a power supply voltage drop, which occurs when current flows to the critical path 19, and an output delay from the critical path 19. As a result, false testing can be avoided, which erroneously assesses defect-free semiconductor circuits as defective ones.

The present invention has been described referring to the embodiments. However, the present invention is not limited to the embodiments but includes other embodiments and modifications without departing from the spirit and the scope as set forth in the accompanying claims.

For example, a critical gate weight CW is inversely proportional to a gate distance and proportional to an activation probability of a critical path. However, even if a critical gate weight CW is, in general, inversely proportional to a power of a gate distance "r" and proportional to a power of an activation probability AP, CW can be expressed in a polynomial equation with the variables of the gate distances "r" and the activation probabilities AP.

Also, a gate critical capture transition metric "cct" of a critical gate can be expressed by multiplying powers of a critical gate weight CW, a transition probability "p," and a signal output line "f," or in a polynomial equation with the variables of the critical gate weight CW, the transition probability "p", and the signal output line "f."

Furthermore, an impact factor IF is varied to have a constant rate among test cubes, but may have a different rate depending on test cubes.

A test approach is not limited to a broadside scheme but may be another approach as long as it is two-pattern testing.

In addition, a test pattern generation method for avoiding false testing in two-pattern testing for a semiconductor integrated circuit according to a second embodiment of the present invention, compared with the first embodiment, comprises:

a first step of generating a two-pattern test set, each pair of test patterns comprising of an initialization pattern for initializing gate states and a launch pattern for causing logic bit transitions with respect to the initialization pattern; and a second step of arranging signal paths, which are formed in the combinational portion by the application of the test patterns, in descending order of path lengths, and selecting a plurality of the paths within a preset path length range as critical paths; wherein by reducing the critical capture transition metric of the critical gate of each of the critical paths, a power supply voltage drop at each of the critical gates is reduced;

excessive delays at each of the critical paths are prevented; and false testing is avoided, which falsely declares a defect-free semiconductor integrated circuit as a defective one.

The second embodiment is applicable to the semiconductor integrated circuit, to which the first embodiment is applied. Also, to the second embodiment for selecting the critical paths and reducing the critical capture transition metrics of the critical gates, the method in the first embodiment for the same is applicable. Therefore, descriptions are omitted regarding the test pattern generation method for avoiding false testing in the two-pattern test for the semiconductor integrated circuit according to the second embodiment of the present invention.

INDUSTRIAL APPLICABILITY

In a test pattern generation method for avoiding false testing in two-pattern testing for a semiconductor integrated circuit according to the present invention, false testing of semiconductor integrated circuits can be avoided, which enables a higher quality test of the circuits. As a result, advanced automation systems for test designs of semiconductor integrated circuits can be constructed.

The invention claimed is:

1. A test pattern generation method for avoiding false testing in two-pattern testing for a semiconductor integrated circuit, comprising:

applying test patterns to a semiconductor integrated circuit having a logic portion comprising a combinational portion with a plurality of gates, each test pattern being a combination of logic values of "0" and "1;"

measuring responses at the rated functional speed of the semiconductor integrated circuit;

comparing the measured responses with expected responses to the test patterns;

determining if the combinational portion is defective;

generating a two-pattern test set, the test patterns comprising an initialization pattern for initializing gate states and a launch pattern for causing logic bit transitions with respect to the initialization pattern, wherein some logic bits for detecting defects in the combinational portion are specified and remaining bits are unspecified bits;

obtaining signal paths formed in the combinational portion by the application of the test patterns based on given information on the combinational portion, arranging the paths in descending order of path lengths;

selecting a plurality of the paths within a preset path length range as critical paths;

identifying critical gates the critical gates including the gates on each of the critical paths, the critical gates existing in a predetermined gate distance from each of the critical paths;

obtaining a critical capture transition (CCT) metric for the critical gates; and assigning a logic value to each unspecified bit in the test patterns so that the critical capture transition (CCT) metric is reduced.

2. The method as defined in claim 1, wherein the critical capture transition metric indicates the impact of the critical gates whose states are changed by the application of the launch test pattern.

3. The method as defined in claim 1, wherein a specified logic value is assigned to the unspecified bit $X_k$, CCT (0) and CCT (1) are obtained, wherein if CCT (0)<CCT (1), "0" is selected for the unspecified bit $X_k$, and if CCT (0)>CCT (1), "1" is selected for the unspecified bit $X_k$.

* * * * *